United States Patent
Wang et al.

(10) Patent No.: US 12,133,416 B2
(45) Date of Patent: Oct. 29, 2024

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Can Wang, Beijing (CN); Qiuyu Ling, Beijing (CN); Renquan Gu, Beijing (CN); Jingkai Ni, Beijing (CN); Yongfa Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 398 days.

(21) Appl. No.: 17/763,871

(22) PCT Filed: May 13, 2021

(86) PCT No.: PCT/CN2021/093472
§ 371 (c)(1),
(2) Date: Mar. 25, 2022

(87) PCT Pub. No.: WO2021/258897
PCT Pub. Date: Dec. 30, 2021

(65) Prior Publication Data
US 2022/0367838 A1    Nov. 17, 2022

(30) Foreign Application Priority Data
Jun. 24, 2020 (CN) .......................... 202010583922.5

(51) Int. Cl.
*H10K 59/38* (2023.01)
*F21V 8/00* (2006.01)
(Continued)

(52) U.S. Cl.
CPC ......... *H10K 50/858* (2023.02); *G02B 3/0056* (2013.01); *G02B 6/0016* (2013.01);
(Continued)

(58) Field of Classification Search
CPC ... H10K 50/858; H10K 59/352; H10K 59/353
See application file for complete search history.

(56) References Cited

U.S. PATENT DOCUMENTS 10,139,669 B2  11/2018  Tateno et al.
10,288,884 B1   5/2019  Gollier et al.
(Continued)

FOREIGN PATENT DOCUMENTS

CN    105242439 A    1/2016
CN    109755282 A    5/2019
(Continued)

OTHER PUBLICATIONS

China Patent Office, First Office Action dated Oct. 8, 2022, for corresponding Chinese application 202010583922.5.

*Primary Examiner* — Charlie Y Peng
(74) *Attorney, Agent, or Firm* — HOUTTEMAN LAW LLC

(57) ABSTRACT

Embodiments of the present disclosure provide a display panel, a manufacturing method thereof, and a display device. The display panel includes a substrate, and a plurality of pixel units on the substrate. The pixel units are arranged in an array, and two adjacent columns of pixel units are spaced apart from each other to form an interval area. Each pixel unit includes a pixel defining layer and sub-pixels, and the sub-pixels are in pixel areas defined by the pixel defining layer. Cathodes of all sub-pixels in one column of pixel units are connected as one single piece.

16 Claims, 7 Drawing Sheets

(51) Int. Cl.
  *G02B 3/00* (2006.01)
  *H10K 50/858* (2023.01)
  *H10K 59/35* (2023.01)
  *H10K 71/00* (2023.01)
  *G02B 27/01* (2006.01)

(52) U.S. Cl.
  CPC ........... *G02B 6/003* (2013.01); *G02B 6/0035* (2013.01); *H10K 59/352* (2023.02); *H10K 71/00* (2023.02); *G02B 27/0101* (2013.01); *G02B 2027/0112* (2013.01); *H10K 59/38* (2023.02)

(56) References Cited

U.S. PATENT DOCUMENTS

| | | | |
|---|---|---|---|
| 10,312,294 | B2 | 6/2019 | Zhou et al. |
| 2007/0146655 | A1* | 6/2007 | Li .................. G03B 21/005 |
| | | | 353/122 |
| 2017/0139211 | A1 | 5/2017 | Trail |
| 2017/0278443 | A1 | 9/2017 | Zhang |
| 2018/0180967 | A1* | 6/2018 | Gao .................. G09G 3/36 |
| 2018/0213209 | A1 | 7/2018 | Cui et al. |
| 2018/0374401 | A1 | 12/2018 | Yang et al. |
| 2020/0227488 | A1 | 7/2020 | Xin et al. |

FOREIGN PATENT DOCUMENTS

| | | |
|---|---|---|
| CN | 111261694 A | 6/2020 |
| CN | 111290115 A | 6/2020 |
| CN | 111682122 A | 9/2020 |
| IN | 105527743 A | 4/2016 |
| WO | WO-2007091611 A1 * | 8/2007 ........... G09G 3/3413 |

* cited by examiner

DISPLAY PANEL, MANUFACTURING METHOD THEREOF, AND DISPLAY DEVICE

CROSS REFERENCE TO RELATED APPLICATION

This application is a National Phase Application filed under 35 U.S.C. 371 as a national stage of PCT/CN2021/093472, filed on May 13, 2021, an application claiming the priority of the Chinese patent application No. 202010583922.5, filed on Jun. 24, 2020, the contents of which are incorporated herein by reference in their entirety.

TECHNICAL FIELD

The embodiment of the disclosure belongs to the field of display technology, and particularly relates to a display panel, a manufacturing method thereof, and a display device.

BACKGROUND

Organic light-Emitting diodes (OLEDs) have been widely used for display panel of mobile phones, vehicle displays, and cameras due to their unique excellent characteristics such as self-luminescence, wide color gamut, fast response, thin panel, flexibility, and low temperature resistance, and have a tendency to replace conventional liquid crystal displays, and become the accepted next-generation screen display technology.

With arousal of people's consciousness on privacy and information protection, especially in public places, peripheral squint may expose the personal world of oneself unconsciously, and OLED display products displaying at a customized angle emerge as the times require.

SUMMARY

The embodiments of the disclosure provide a display panel, a manufacturing method thereof, and a display device.

In a first aspect, embodiments of the present disclosure provide a display panel, including: a substrate; a sub-pixel array disposed on the substrate; and a microlens array disposed on one side of the sub-pixel array far away from the substrate; sub-pixels in the sub-pixel array are arranged in one-to-one correspondence with microlenses in the microlens array;

each microlens is offset, by n times of a set value, from a corresponding one of the sub-pixels in a first direction in which the sub-pixels are arranged, n being an ordinal number of the corresponding sub-pixel in the first direction; and aperture ratios of the sub-pixels are gradually reduced along the first direction.

In some embodiments, the first direction is a row direction of the sub-pixel array or a column direction of the sub-pixel array; and the aperture ratios of the sub-pixels are calculated by the following equation:

$$\left[X - \left(n * \frac{X-Y}{N}\right)\right]\%;$$

X is a maximum aperture ratio of the sub-pixels along the first direction, Y is a minimum aperture ratio of the sub-pixels along the first direction, n is an ordinal number of the sub-pixel in the first direction, and N is a total number of the sub-pixels.

In some embodiments, wherein the first direction is a direction from one ends of rows of the sub-pixel array to the other ends of the rows of the sub-pixel array, and light emitted by the sub-pixels is deflected from the one ends to the other ends of the rows of the sub-pixel array along the first direction; or the first direction is a direction from one ends of columns of the sub-pixel array to the other ends of the columns of the sub-pixel array, and light emitted by the sub-pixels is deflected from the one ends to the other ends of the columns of the sub-pixel array along the first direction.

In some embodiments, the first direction is a direction from middle of rows of the sub-pixel array to either ends of the rows of the sub-pixel array, and light emitted by the sub-pixels is deflected from the middle of the rows of the sub-pixel array to either ends of the rows of the sub-pixel array along the first direction; or the first direction is a direction from middle of columns of the sub-pixel array to either ends of the columns of the sub-pixel array, and light emitted by the sub-pixels is deflected from the middle of the columns of the sub-pixel array to either ends of the columns of the sub-pixel array along the first direction.

In some embodiments, a deflection angle of light emitted from a first one of the sub-pixels along the first direction is 0°.

In some embodiments, an overall offset amount of the microlens array with respect to the sub-pixel array along the first direction is calculated by following equations:

$$l = h\,\tan\theta_1;$$

and $$\theta_1 = \arcsin(n2/n1)*\sin\theta_2;$$

l is the overall offset amount, h is a distance between a light-exiting surface of the microlens array and a light-exiting surface of the sub-pixel array, $\theta_2$ is a maximum deflection angle of light emitted by the sub-pixels and exiting the microlenses, $\theta_1$ is an incident angle of light emitted by the sub-pixels and incident to the microlenses, n1 is a refractive index of a filling layer in the microlenses, and n2 is a refractive index of air.

In some embodiments, apertures of the microlenses along the first direction are the same, and an offset amount of each microlens with respect to a corresponding one of the sub-pixels is calculated by following equation:

$$ln = (n\,h\,\tan\theta_1)/N;$$

ln is offset amount of a n-th microlens with respect to its corresponding sub-pixel along the first direction, n is an ordinal number of the sub-pixel in the first direction, n=1, 2, 3 . . . N, and N is a total number of the sub-pixels.

In some embodiments, an incident angle of light incident to each microlens is calculated by following equation:

$$\theta_n = \arctan\,ln/h = \arctan(n\,\tan\theta_1)/N;$$

$\theta_n$ is an incident angle of light incident to the n-th microlens, ln is the offset amount of the n-th microlens with respect to the corresponding sub-pixel in the first direction, n is the ordinal number of the sub-pixels in the first direction, n=1, 2, 3 . . . N, and N is the total number of the sub-pixels.

In some embodiments, each of the sub-pixels includes an anode, a light emitting functional layer, and a cathode sequentially stacked in a direction far away from the substrate;

the display panel further comprises a pixel defining layer in which a plurality of openings arranged in an array are disposed; and anodes of the sub-pixels are respectively located in the plurality of openings of the pixel defining layer.

In some embodiments, the light emitting function layers of the sub-pixels are respectively located in the plurality of openings of the pixel defining layer.

In some embodiments, the display panel further includes a light-shielding layer on a side of the cathodes far away from the substrate and a side of the microlens array close to the substrate, an orthogonal projection of the light-shielding layer on the substrate is in a gap area between orthogonal projections of adjacent ones of the microlenses on the substrate, and a spacing between any adjacent two of the microlenses in the microlens array in the first direction is equal; and a width of the light-shielding layer is equal to an offset amount of a first one of the two adjacent microlenses along the first direction with respect to a corresponding one of the sub-pixels; or the width of the light-shielding layer is equal to a distance between the two adjacent microlenses along the first direction.

In a second aspect, an embodiment of the present disclosure further provides a display apparatus, including the display panel as described above, and an optical device disposed at a light-exiting side of the display panel;

the optical device comprises: a collimator on the light-exiting side of the display panel; a waveguide transmission device on a side of the collimator far away from the display panel; and an input grating and an output grating on a side of the waveguide transmission device far away from the display panel, the input grating and the output grating being disposed at one end and the other end of the waveguide transmission device, respectively; and light emitted from the collimator is incident to the input grating at a set incident angle, and the set incident angle is greater than 0° and less than 90°.

In a third aspect, an embodiment of the present disclosure further provides a method for manufacturing a display panel, including:

step S1: manufacturing a sub-pixel array on a substrate; and step S2: manufacturing a microlens array on the substrate on which the step S1 has been performed;

sub-pixels in the sub-pixel array are arranged in one-to-one correspondence with microlenses in the microlens array, the sub-pixels are arranged along a first direction, the microlenses are offset from corresponding sub-pixels along the first direction by n times of a set value, n is an ordinal number of the sub-pixels along the first direction, and aperture ratios of the sub-pixels gradually decrease along the first direction.

In some embodiments, the step S1 includes:

determining a maximum aperture ratio of the sub-pixels and a minimum aperture ratio of the sub-pixels along the first direction; and calculating aperture ratios of each sub-pixel according to the maximum aperture ratio of the sub-pixels and the minimum aperture ratio of the sub-pixels.

In some embodiments, the step S2 includes:

calculating, according to a given maximum deflection angle by which light emitted by the sub-pixels and exiting the microlenses is deflected, an overall offset amount of the micro-lens array with respect to the sub-pixel array along the first direction;

calculating an offset amount of each microlens with respect to a corresponding one of the sub-pixels along the first direction according to the overall offset amount, wherein apertures of the microlenses are the same; and calculating an incident angle of light emitted by each sub-pixel and incident to a corresponding one of the microlenses according to the offset of microlens with respect to the corresponding sub-pixel.

BRIEF DESCRIPTION OF DRAWINGS

The accompanying drawings that are included to provide a further understanding of the embodiments of the disclosure, and are incorporated in and constitute a part of this specification, explain the principle of the disclosure together with the description, and are not intended to limit the disclosure. The above and other features and advantages will become more apparent to those skilled in the art by describing in detail example embodiments thereof with reference to the attached drawings, in which.

Figure 1:
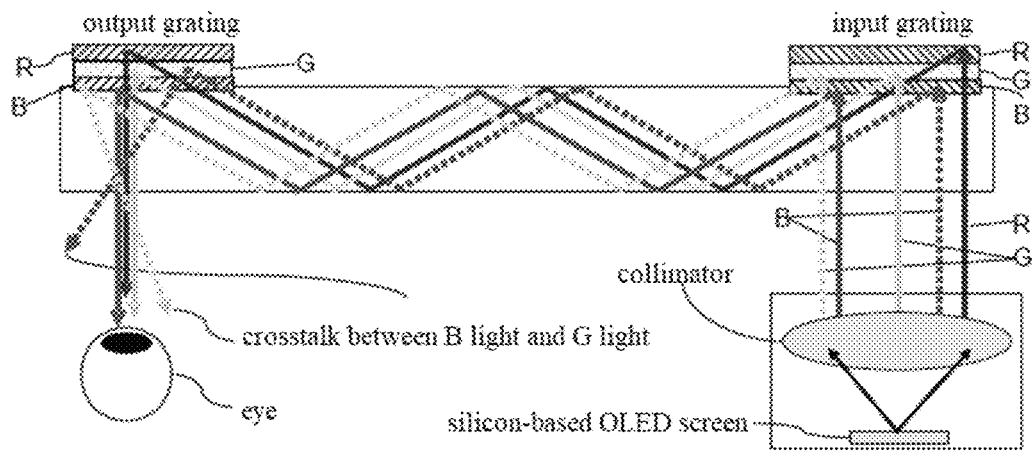
FIG. 1 is a schematic diagram of color crosstalk caused by normal-viewing-angle incidence when a silicon-based OLED is used in an AR system.

The reference numbers are defined as follows:

1. a substrate; 2. a sub-pixels array; 21. a sub-pixel; 210. an anode; 211. a light-emitting functional layer; 212. a cathode; 3. a microlens array; 31. a microlens; 4. an encapsulation layer; 5. a color film layer; 6. a pixel defining layer; and 7. a light-shielding layer.

DETAIL DESCRIPTION OF EMBODIMENTS

In order to make those skilled in the art better understand the technical solutions of the embodiments of the present disclosure, a display panel, a manufacturing method thereof, and a display device provided in the embodiments of the present disclosure are described in further detail below with reference to the accompanying drawings and the detailed description.

The embodiments of the present disclosure will be described more fully hereinafter with reference to the accompanying drawings, but the embodiments shown may be embodied in different forms and should not be construed as limiting the embodiments set forth in the present disclosure. Rather, these embodiments are provided so that this disclosure will be thorough and complete, and will fully convey the scope of the disclosure to those skilled in the art.

The embodiments of the present disclosure are not limited to the embodiments shown in the drawings, but include modifications of configurations formed based on a manufacturing process. Thus, the regions exemplarily shown in the figures are illustrative, and the shapes of the regions shown in the figures illustrate specific shapes of the regions, but are not intended to be limiting.

Augmented Reality (AR) is a technology that calculates the position and angle of camera images in real time and adds corresponding images, and it is also a new technology that "seamlessly" integrates real world information and virtual world information. The goal of this technology is to combine the virtual world with the real world and interact with the real world on the screen. AR has been developed rapidly in recent years, the high-end products use optical waveguide technology to become light and thin, and a silicon-based OLED screen has self-luminescence and lightness, which can meet the portable needs of AR. The applicant found that when the silicon-based OLED is used in AR systems, if light is incident at a normal viewing angle, crosstalk between colors is liable to occurred, as shown in FIG. 1. When the light enters into an optical grating, it satisfies the Bragg wavelength grating equation: $\lambda_B = 2n\Lambda \sin\theta_B$, where $\lambda_B$ is a Bragg wavelength of the incident light, $\theta_B$ is an incident angle, and $\theta$ is a slit width of the grating; it also satisfies the wavelength sensitivity (that varies with the incident angle) equation:

$$\frac{\delta\lambda_B}{\delta\theta_B} = 2n\Lambda\cos\theta_B,$$

the larger the incident angle $\theta_B$, the lower the wavelength sensitivity of the Bragg grating, that is, the lower the probability of diffraction in transmission. Therefore, in order to reduce the wavelength sensitivity, it is necessary to increase the incident angle $\theta_B$ of the incident light. For OLED microdisplay devices, the normal viewing angle cannot be used, but a specific customized angle is needed.

Figure 2:
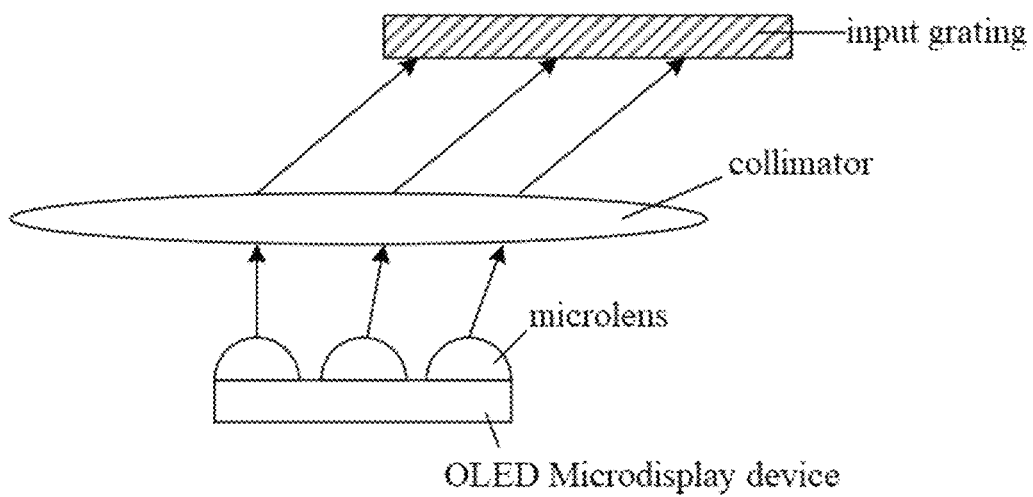
FIG. 2 is a schematic diagram of an OLED micro-display device displaying at a specific customized angle by using a microlens in the technologies that have been published.

As shown in FIG. 2, the customization of the specific angle of the OLED microdisplay device is implemented by using the microlens, and it is found in the implantation of the customization of the specific angle of the OLED microdisplay device that the brightness uniformity cannot meet the product requirement. As shown in Table 1, in order to implement a customized angle up to 21°, the entire microlens needs to have an offset of 0.8 but the uniformity of the sub-pixel brightness at the angle 21° cannot meet the requirement of 90%.

TABLE 1

| offset of lens/μm | 0 | 0.2 | 0.4 | 0.6 | 0.8 |
|---|---|---|---|---|---|
| customized angle/° | 0 | 5.34 | 10.66 | 15.94 | 21.14 |
| luminance/nit | 2486 | 2475 | 2424 | 2242 | 2097 |

In order to solve the above problems, it is necessary to improve the uniformity of brightness.

In view of the problem that the brightness uniformity cannot meet the product requirement when the customization of the specific angle of the OLED microdisplay device is implemented by using the microlens, the embodiments of the disclosure provide a display panel, a manufacturing method thereof and a display device.

Figure 3:
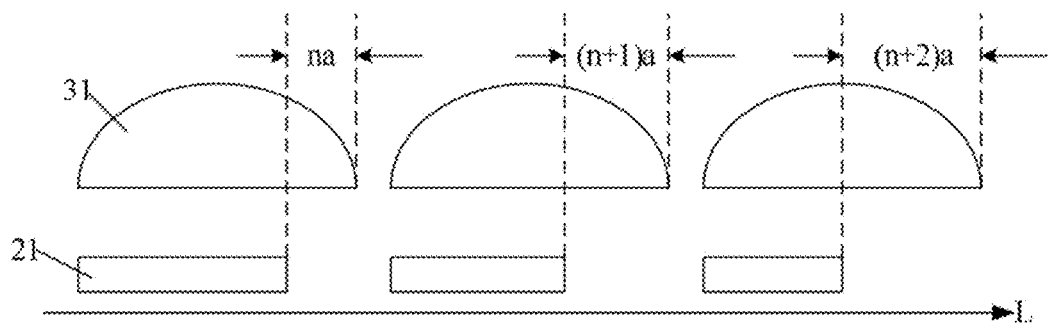
FIG. 3 is a schematic diagram illustrating that microlenses of a display panel according to an embodiment of the disclosure are arranged to be offset with respect to sub-pixels having different aperture ratios.
Figure 4:
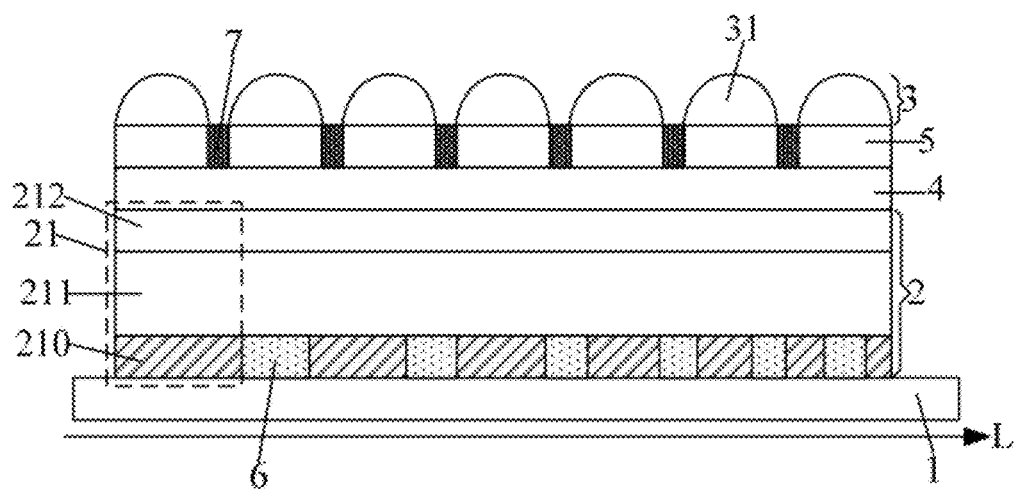
FIG. 4 is a schematic cross-sectional view illustrating a structure of a display panel according to an embodiment of the present disclosure.

The embodiment of the present disclosure provides a display panel. As shown in FIGS. 3 and 4, the display panel includes a substrate 1; a sub-pixel array 2 disposed on the substrate 1; and a microlens array 3 disposed on one side of the sub-pixel array 2 far away from the substrate 1. The sub-pixels 21 in the sub-pixel array 2 are arranged in a one-to-one correspondence with the microlenses 31 in the microlens array 3. The sub-pixels 21 are arranged in a first direction L, and each microlens 31 is offset in the first direction L from its corresponding sub-pixel 21 by n times of a set value "a", where n is an ordinal number of the corresponding sub-pixel 21 along the first direction L. The aperture ratios of sub-pixels 21 gradually decrease along the first direction L.

Figure 5:
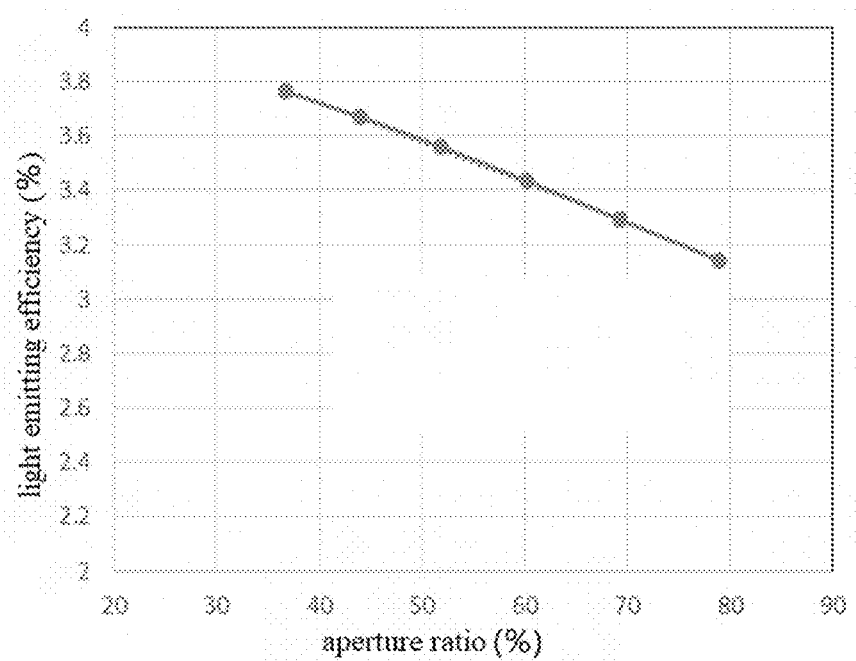
FIG. 5 is a graph in which light emitting efficiency of the sub-pixel varies with an aperture ratio thereof.

By offsetting each microlens 31 by n times of the set value "a" with respect to its corresponding sub-pixel 21 along the first direction L, the light emitted from each microlens 31 can be deflected by different angles through the corresponding microlens 31, and the deflection angle of the light exiting the microlenses 31 gradually increases along the first direction L, so that the display panel performs display with a customized angle. However, the displaying with the customized angle may reduce the light emitting efficiency of the display panel, and deteriorate the display brightness uniformity of each sub-pixel 21 such that the requirement of the brightness uniformity of 90% or more cannot be satisfied. Because the light emitting efficiency increases with the decrease of the aperture ratio, as shown in FIG. 5, by gradually decreasing the aperture ratios of sub-pixels 21 along the first direction L, the light emitting efficiency lost when the display panel performs display with the customized angle can be compensated, thereby improving the light emitting efficiency when the display panel performs display with the customized angle and also improving the uniformity of the display luminance of each sub-pixel 21.

By offsetting shifting the microlenses 31 with respect to the corresponding sub-pixels 21 by n times of the set value "a" along the first direction L, the light emitted by each sub-pixel 21 can be deflected by different angles through the corresponding microlens 31, and the deflection angles of the light exiting the microlens 31 are gradually increased, so that the display panel performs display with a customized angle, thereby meeting the requirement of displaying with the customized angle for the display panel. Meanwhile, by gradually reducing the aperture ratios of sub-pixels 21 along the first direction L, the uniformity of the brightness of sub-pixels 21 of the display panel is greater than or equal to 90% when the display panel performs display with the customized angle. Therefore, when the display panel performs display with the customized angle, not only the light efficiency is improved, but also the brightness uniformity is improved, thereby improving the display effect of the display panel. In addition, by the displaying with the customized angle, the color crosstalk phenomenon occurred when the display panel is used for the augmented reality display can be improved, and the color range of the display panel when performing display is maximized.

In some embodiments, the first direction L is a row direction of the sub-pixel array 2 or a column direction of the sub-pixel array 2, and respective aperture ratios of sub-pixels 21 along the first direction L are calculated by the following equation:

$$\left[X - \left(n * \frac{X-Y}{N}\right)\right]\%, \quad (1)$$

where X is a maximum aperture ratio of the sub-pixels 21 along the first direction L, Y is a minimum aperture ratio of the sub-pixels 21 along the first direction L, n is an ordinal number of the sub-pixel 21 along the first direction L, and N is a total number of the sub-pixels 21 along the first direction L.

In the present embodiment, the maximum aperture ratio and the minimum aperture ratio of the sub-pixels 21 can be obtained by a simulation test. The maximum aperture ratio of the sub-pixels corresponds to the sub-pixel from which the light is emitted and deflected through the corresponding microlens by the minimum deflection angle, and the minimum aperture ratio of the sub-pixels corresponds to the sub-pixel from which the light is emitted and deflected through the corresponding microlens by the maximum deflection angle. The specific simulation test process is as follows. An aperture ratio assignment is performed on the sub-pixel having the minimum deflection angle and the sub-pixel 21 having the maximum deflection angle to test whether the uniformity of the luminous intensity of the two sub-pixels 21 (i.e., the sub-pixel 21 having the maximum deflection angle and the sub-pixel 21 having the minimum deflection angle) can reach 90% or more. If the uniformity of the luminous intensity of the two sub-pixels 21 reaches 90% or more, the assigned aperture ratios are respectively determined to be the actual maximum aperture ratio and the actual minimum aperture ratio. Then, the aperture ratios of middle sub-pixels 21 (that is, the sub-pixels 21 arranged between the two sub-pixels 21 having the maximum aperture ratio and the minimum aperture ratio) in the first direction L can be calculated by the above equation (1). By setting the aperture ratios of sub-pixels 21 of the display panel according to the above equation (1), the uniformity of the display luminance of the display panel satisfies 90% or more, while the display panel can perform display with the customized angle.

For example, a first sub-pixel of the sub-pixels in the first direction L has the maximum aperture ratio, for example, an original aperture ratio 60% of the first sub-pixel, and the aperture ratio (i.e., the minimum aperture ratio) of a last sub-pixel of the sub-pixels in the first direction L is calculated to be 44% on condition that the requirement of the brightness uniformity 90% is satisfied. Along the first direction L, the aperture ratio of the middle sub-pixels located between the first sub-pixel and the last sub-pixel are calculated according to the above equation (1):

$$\left[60 - \left(n * \frac{60-44}{N}\right)\right]\%.$$

Figure 6:
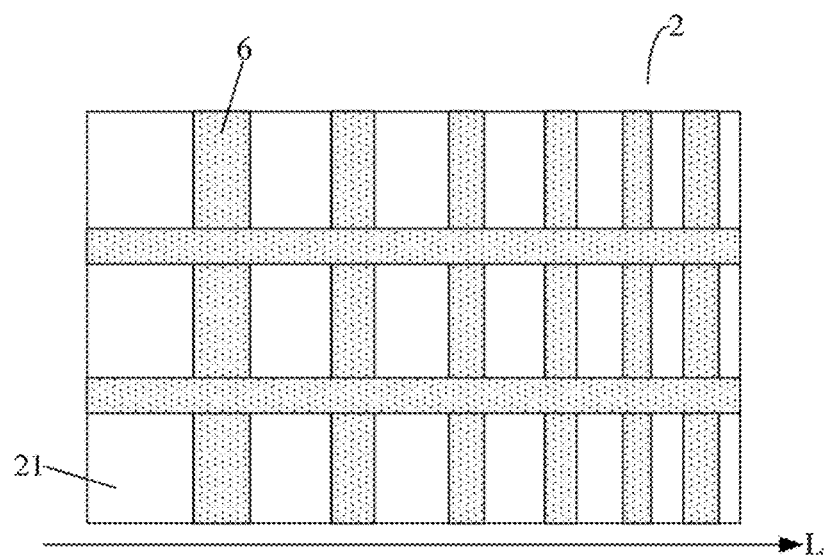
FIG. 6 is a schematic top view illustrating a structure in which the aperture ratio of the sub-pixels varies along a first direction according to an embodiment of the present disclosure.
Figure 7:
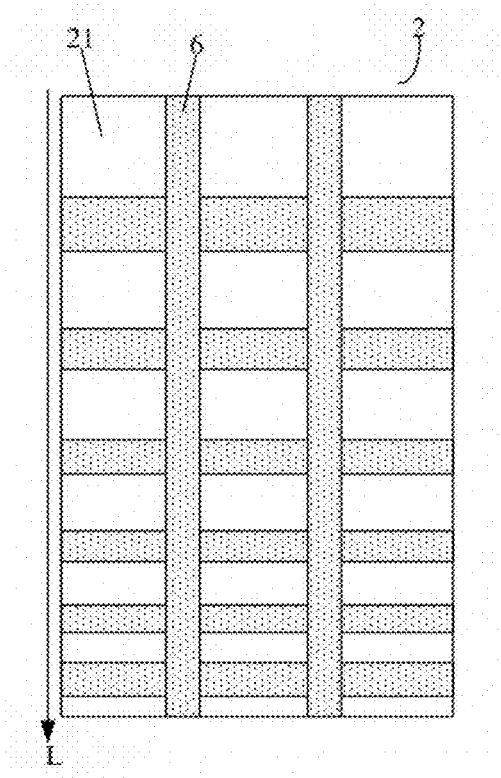
FIG. 7 is a schematic top view illustrating another structure in which the aperture ratio of the sub-pixels varies along the first direction according to an embodiment of the present disclosure.

In some embodiments, as shown in FIG. 6, the first direction L is a direction from one ends of rows of the sub-pixel array to the other ends of the rows of the sub-pixel array, and light emitted by the sub-pixels is deflected from the one ends to the other ends of the rows of the sub-pixel array along the first direction L. Alternatively, as shown in FIG. 7, the first direction L is a direction from one ends of columns of the sub-pixel array to the other ends of the columns of the sub-pixel array, and light emitted by the sub-pixels is deflected from the one ends to the other ends of the columns of the sub-pixel array along the first direction L.

Figure 8:
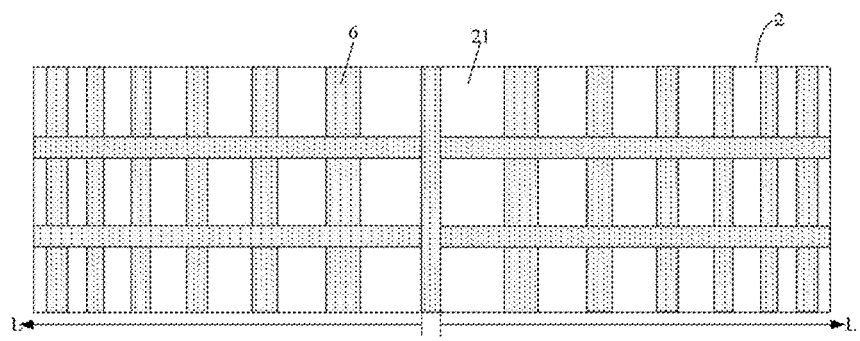
FIG. 8 is a schematic top view illustrating still another structure in which the aperture ratio of the sub-pixel varies along the first direction according to an embodiment of the present disclosure.
Figure 9:
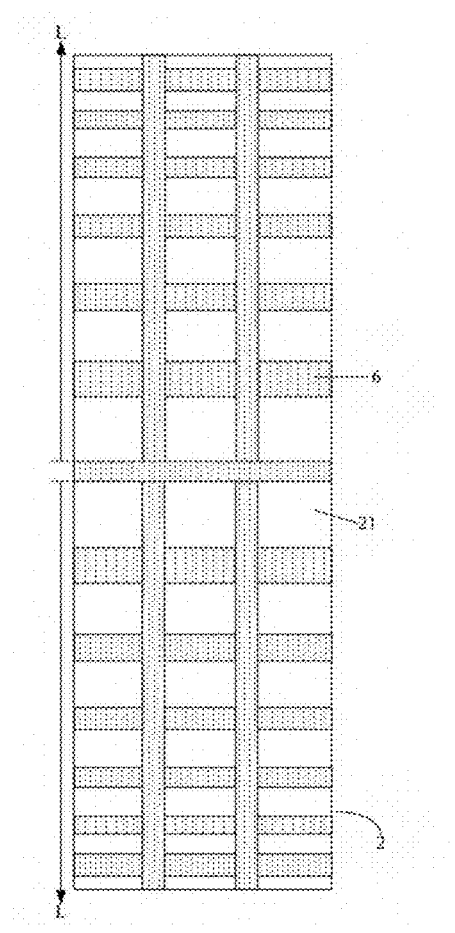
FIG. 9 is a schematic top view illustrating still another structure in which the aperture ratio of the sub-pixel varies along the first direction according to an embodiment of the present disclosure.

In some embodiments, as shown in FIG. 8, the first direction L is a direction from the middle of the rows of the sub-pixel array to either ends of the rows of the sub-pixel array, and light emitted by the sub-pixels is deflected from the middle to either ends of the rows of the sub-pixel array along the row direction L. Alternatively, as shown in FIG. 9, the first direction L is a direction from the middle of the columns of the sub-pixel array to either ends of the columns of the sub-pixel array, and light emitted by the sub-pixels is deflected from the middle to either ends of the columns of the sub-pixel array along the column direction L.

The determination of the first direction L varies according to the specific angle customization scheme of the display panel, and the first direction L is not limited to the above cases.

In some embodiments, the deflection angle of the light emitted from the first microlens along the first direction L is $0°$. Of course, the deflection angle of the light emitted from the first microlens may also be larger than $0°$.

Figure 10:
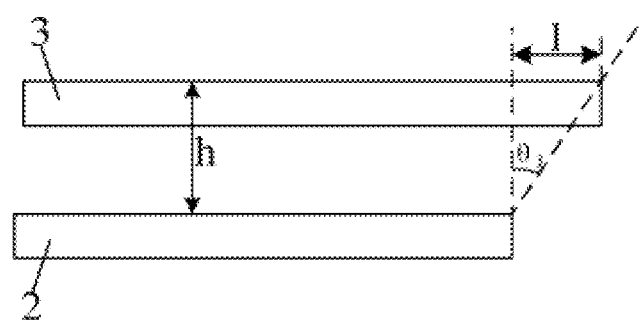
FIG. 10 is a schematic diagram illustrating an overall offset of a microlens array with respect to a sub-pixel array according to an embodiment of the present disclosure.
Figure 11:
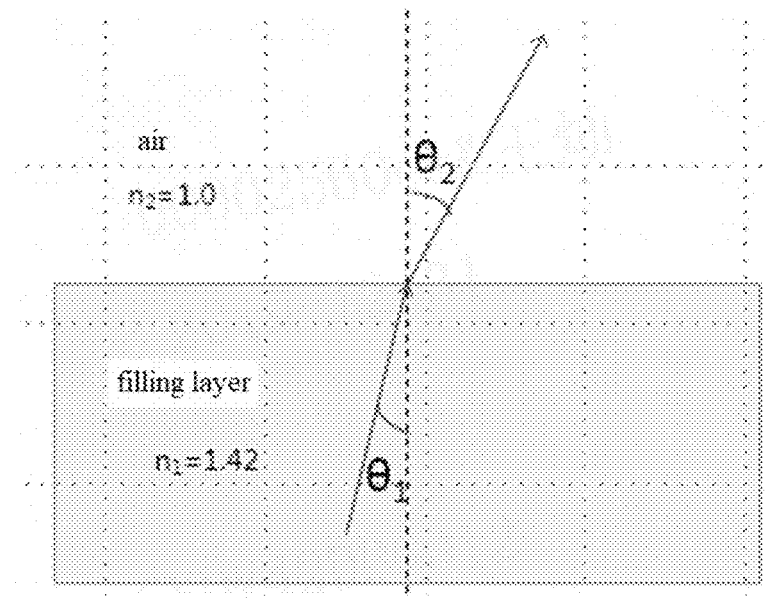
FIG. 11 is a schematic diagram illustrating an incident light refracted by a microlens filling layer according to an embodiment of the disclosure.

In some embodiments, as shown in FIGS. 10 and 11, the overall offset amount of the microlens array 3 with respect to the sub-pixel array 2 along the first direction L is calculated by equations (2) and (3):

$$l = h \tan\theta_1 \quad (2),$$

$$\theta_1 = \arcsin(n2/n1) * \sin\theta_2 \quad (3),$$

where l is the overall offset amount; h is the distance between the light-exiting surface of the microlens array 3 and the light-exiting surface of the sub-pixel array 2; $\theta_2$ is the maximum deflection angle of the light emitted by the sub-pixels and exiting the microlens 31 along the first direction L; $\theta_1$ is an incident angle of the light emitted by the sub-pixels and incident to the microlens 31; n1 is the refractive index of the microlens filling layer; n2 is the refractive index of air.

The maximum deflection angle $\theta_2$ can be obtained according to the user's requirement for the displaying of the display panel with a customized angle, and the overall offset amount of the microlens array 3 with respect to the sub-pixel array 2 can be calculated according to the maximum deflection angle $\theta_2$, so as to provide a calculation basis for the specific parameter design of each microlens in the microlens array 3. Other films, such as a packaging layer 4 and a color film layer 5, are disposed between the microlens array 3 and the sub-pixel array 2, so that there is a certain distance between the light-exiting surface of the microlens array 3 and the light-exiting surface of the sub-pixel array 2. In addition, in order to realize the displaying of the display panel with a customized angle, a filling layer having a refractive index different from that of the microlenses is provided in the microlenses 31 or on the surface layer thereof, and the filling layer having the above refractive index can assist the displaying of the display panel with a customized angle.

In some embodiments, the apertures of the microlenses are the same along the first direction L, and the offset amount of each microlens with respect to its corresponding sub-pixel is calculated by equation (4):

$$ln=(n\ h\ \tan\theta_1)/N \quad (4),$$

where ln is an offset amount of an n-th microlens with respect to its corresponding sub-pixel along the first direction L; n is an ordinal number of the sub-pixel along the first direction L, n=1, 2, 3 . . . N; N is the total number of sub-pixels along the first direction L.

Figure 12:
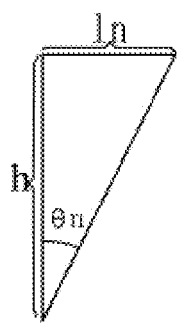
FIG. 12 is a schematic diagram illustrating a principle of calculating an incident angle of light of a sub-pixel incident to a microlens corresponding to the sub-pixel, according to an offset amount of the microlens with respect to the corresponding sub-pixel in an embodiment of the present disclosure.

In some embodiments, the incident angle of light emitted from each sub-pixel and incident to the corresponding microlens along the first direction L is calculated by equation (5):

$$\theta_n=\arctan ln/h=\arctan(n\ \tan\theta_1)/N \quad (5),$$

where $\theta_n$ is an incident angle of the light emitted from an n-th sub-pixel and incident to the corresponding (i.e., n-th) microlens along the first direction L; ln is the offset amount of the n-th microlens with respect to the n-th sub-pixel along the first direction L; n is the ordinal number of the sub-pixel along the first direction L, and n=1, 2, 3 . . . N; N is the total number of sub-pixels or the microlenses along the first direction L. That is, the incident angle $\theta_n$ of light emitted from the sub-pixel and incident to the corresponding microlens along the first direction L can be calculated based on the offset amount of each microlens with respect to its corresponding sub-pixel calculated by the equation (2) and a tangent calculation equation of the angle (as shown in FIG. 12). Accordingly, the microlens can be designed according to the incident angle of the light emitted from the corresponding sub-pixel and incident to the microlens, thereby realizing the displaying of the display panel with a customized angle.

For example, assuming that the maximum deflection angle of the light exiting the microlenses along the first direction is 21°, the incident angle of the light incident to the microlens calculated according to the equation (3) is 14.93°; the overall offset amount of the microlens array with respect to the sub-pixel array along the first direction can be calculated according to the equation (2); the offset amount of each microlens with respect to the corresponding sub-pixel along the first direction can be calculated according to the overall offset amount and the equation (4); and the incident angle of the light incident to the microlens along the first direction can be calculated according to the offset amount of each microlens with respect to the corresponding sub-pixel and a tangent equation of the angle. As shown in Table 2:

TABLE 2

| offset amount of microlens/μm | 0 | 0.2 | 0.3 | 0.4 | 0.5 | 0.6 | 0.7 | 0.8 |
|---|---|---|---|---|---|---|---|---|
| incident angle of microlens(n = 1.4)/° | 0 | 3.81 | 5.71 | 7.59 | 9.46 | 11.31 | 13.13 | 14.93 |
| exit angle of microlens/° | 0 | 5.34 | 8.01 | 10.66 | 13.31 | 15.94 | 18.54 | 21.14 |

In some embodiments, as shown in FIG. 4, the sub-pixel 21 includes an anode 210, a light emitting functional layer 211, and a cathode 212, which are sequentially stacked in a direction far away from the substrate 1. The display panel further includes a pixel defining layer 6 in which a plurality of openings arranged in an array are disposed, and respective anodes 210 of the sub-pixels 21 are located in the openings.

In some embodiments, the display panel further includes a light-shielding layer 7 disposed on one side of the cathode 212 away from the substrate 1 and one side of the microlens array 3 close to the substrate 1. The orthographic projection of the light-shielding layer 7 on the substrate 1 is positioned in an interval area between the orthographic projections of the adjacent microlenses 31 on the substrate 1. In the microlens array 3, the spacing between any two adjacent microlenses 31 along the first direction L is equal, and the width of the light-shielding layer 7 in the first direction L is equal to the offset amount of the former one of the two adjacent microlenses 31 with respect to its corresponding sub-pixel 21. By the above setting of the width of the light-shielding layer 7, the color crosstalk between adjacent sub-pixels 21 can be better avoided, so that the color range of the display panel can be maximized when the display panel performs display with a customized angle.

It should be noted that, the width of the light-shielding layer along the first direction may also be equal to the spacing between two adjacent microlenses. That is, the widths of the light-shielding layers in a spacing region between the adjacent microlenses are equal, so that the color crosstalk between the adjacent sub-pixels can be improved and the color range of the display panel can be maximized when the display panel is displayed at the customized angle.

In present embodiment, the light-shielding layer 7 and the color film layer 5 are disposed at the same layer, and the color film layer 5 includes a plurality of red, green, and blue color blocking portions. The color blocking portions are arranged in one-to-one correspondence with the sub-pixels 21, and the light-shielding layer 7 is located between adjacent color blocking portions. In present embodiment, the light emitted by each sub-pixel 21 is white light, and the disposing of the color film layer 5 may facilitate color display of the display panel.

The present embodiment further provides a method for manufacturing the display panel having the above structure, including steps S1 and S2. At step S1: an array of sub-pixels is prepared on a substrate.

At step S2: a microlens array is manufactured on the substrate formed after completing step S1.

The sub-pixels in the sub-pixel array are arranged in one-to-one correspondence with the microlenses in the microlens array, the sub-pixels are arranged along a first direction, and each microlens is offset by n times of a set value with respect to the corresponding sub-pixel in the first direction, where n is an ordinal number of the sub-pixels along the first direction, and the aperture ratios of sub-pixels gradually decrease along the first direction.

Step S1 includes following steps S11 and S12.

At step S11: a maximum aperture ratio and a minimum aperture ratio of the sub-pixels along the first direction are determined.

At step S12: the aperture ratios of other sub-pixels along the first direction are calculated according to the maximum aperture ratio and the minimum aperture ratio of the sub-pixels.

The maximum aperture ratio and the minimum aperture ratio of the sub-pixels can be obtained by a simulation test. The maximum aperture ratio of the sub-pixels corresponds to the sub-pixel from which the light is emitted and deflected through the corresponding microlens by the minimum deflection angle, and the minimum aperture ratio of the sub-pixels corresponds to the sub-pixel from which the light is emitted and deflected through the corresponding microlens by the maximum deflection angle. The specific simulation test process is as follows. An aperture ratio assignment is performed on the sub-pixel having the minimum deflection angle and the sub-pixel 21 having the maximum deflection angle to test whether the uniformity of the luminous intensity of the two sub-pixels 21 (i.e., the sub-pixel 21 having the maximum deflection angle and the sub-pixel 21 having the minimum deflection angle) can reach 90% or more. If the uniformity of the luminous intensity of the two sub-pixels 21 reaches 90% or more, the assigned aperture ratios are respectively determined to be the actual maximum aperture ratio and the actual minimum aperture ratio. Then, the aperture ratios of middle sub-pixels 21 (that is, the sub-pixels 21 arranged between the two sub-pixels 21 having the maximum aperture ratio and the minimum aperture ratio) in the first direction L can be calculated by the above equation (1). By setting the aperture ratios of sub-pixels 21 of the display panel according to the above equation (1), the uniformity of the display luminance of the display panel satisfies 90% or more, while the display panel can perform display with the customized angle.

In present embodiment, step S2 further includes following steps S21 to S23.

At step S21: the overall offset amount of the microlens array with respect to the sub-pixel array in a first direction is calculated based on a given maximum deflection angle of the light exiting the microlenses.

In this step, the overall offset amount of the microlens array with respect to the sub-pixel array is calculated according to equations (2) and (3) in the present embodiment.

At step S22: the offset amounts of microlenses with respect to the corresponding sub-pixels along the first direction are calculated according to the overall offset amount, with the apertures of microlenses being the same.

In this step, the offset amounts of microlenses with respect to its corresponding sub-pixels are calculated according to equation (4) in the present embodiment.

At step S23: the incident angle of the light emitted from each sub-pixel and incident to the corresponding microlens along the first direction is calculated according to the offset amount of each microlens with respect to the corresponding sub-pixel.

In this step, the incident angle of the light incident to the microlens is calculated according to the equation (5) in present embodiment, and the microlens is designed according to the calculated incident angle, so that the display panel performs display with the customized angle.

Figure 13:
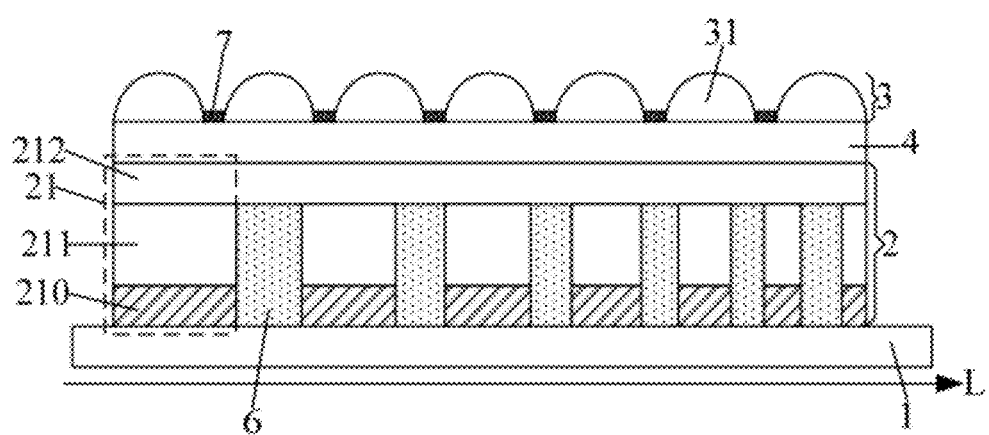
FIG. 13 is a schematic cross-sectional view of a display panel according to another embodiment of the disclosure.

The embodiment of the present disclosure further provides a display panel, which is different from the above embodiment in that, as shown in FIG. 13, the light emitting function layers 211 of the sub-pixels 21 are respectively located in the openings of the pixel defining layer 6. In present embodiment, the sub-pixels 21 emit light with different colors (such as red, green, and blue), so the display panel in present embodiment can achieve color display without a color film layer.

Other structures of the display panel and the manufacturing method of the display panel in present embodiment are the same as those in the above embodiment, and are not described again here.

In the display panel provided in the above embodiment, by offsetting each microlens by n times of the set value with respect to its corresponding sub-pixel along the first direction in which the sub-pixels are arranged, light emitted by each sub-pixel can be deflected by different angles through the corresponding microlens, and the deflection angles of the light exiting the microlenses gradually increase in the first direction, so that the display panel performs display with a customized angle, thereby meeting the requirement of the displaying of the display panel with the customized angle. Also, the aperture ratios of sub-pixels are gradually reduced along the first direction, so that the uniformity of the brightness of each sub-pixel of the display panel is greater than or equal to 90% when the display panel performs display with the customized angle. Therefore, not only the light efficiency but also the brightness uniformity when the display panel performs displayed with the customized angle are improved, thereby improving the display effect of the display panel. In addition, by the displaying with the customized angle, the color crosstalk phenomenon occurred when the display panel is used for the augmented reality display can be improved, so that the color range of the display panel when displaying is maximized.

The embodiment of the present disclosure further provides a display device, which includes the display panel in any of the above embodiments, and further includes an optical device disposed on the light-exiting side of the display panel, and the optical device including a collimator, an input grating, a waveguide transmission device and an output grating. The collimator is disposed on the light-exiting side of the display panel, the waveguide transmission device is disposed on one side of the collimator far away from the display panel, and the input grating and the output grating are disposed on one side of the waveguide transmission device far away from the display panel, the input grating and the output grating are respectively disposed at both ends of the waveguide transmission device, and the light emitted from the collimator is incident to the input grating at a set incident angle greater than 0° and less than 90°.

The light emitted by the display panel is incident to the collimator, the light emitted from the collimator is incident to the input grating at a set incident angle, the light emitted from the input grating is transmitted to the output grating through the waveguide transmission device, and the light emitted from the output grating enters human eyes, so that the augmented reality display of the display device is realized.

By using the display panel in any embodiments, not only the light efficiency of the display device when displaying with the customized angle can be improved, but also the brightness uniformity of the display device when displaying with the customized angle can be improved, thereby improving the display effect of the display device. Also, the color crosstalk phenomenon of the display device during augmented reality display can also be improved, so that the the color range of the display device during display can be maximized.

The display device provided by the embodiment of the disclosure can be any product or component having a display function, such as an OLED panel, an OLED television, a display, a mobile phone, a navigator or the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A display panel comprising:
    a substrate;
    a sub-pixel array on the substrate; and
    a microlens array on a side of the sub-pixel array far away from the substrate,
    wherein sub-pixels in the sub-pixel array are arranged in one-to-one correspondence with microlenses in the microlens array,
    wherein each microlens is offset, by n times of a set value, from a corresponding one of the sub-pixels in a first direction in which the sub-pixels are arranged, n being an ordinal number of the corresponding sub-pixel in the first direction, and
    wherein aperture ratios of the sub-pixels are gradually reduced along the first direction.

2. The display panel of claim 1, wherein the first direction is a row direction of the sub-pixel array or a column direction of the sub-pixel array, and
    wherein the aperture ratio of each sub-pixel is calculated by the following equation:

$$\left[X-\left(n*\frac{X-Y}{N}\right)\right]\%,$$

where X is a maximum aperture ratio of the sub-pixels along the first direction, Y is a minimum aperture ratio of the sub-pixels along the first direction and N is a total number of the sub-pixels.

3. The display panel of claim 2, wherein the first direction is a direction from one ends of rows of the sub-pixel array to the other ends of the rows of the sub-pixel array, and light emitted by the sub-pixels is deflected from the one ends to the other ends of the rows of the sub-pixel array along the first direction; or
    wherein the first direction is a direction from one ends of columns of the sub-pixel array to the other ends of the columns of the sub-pixel array, and light emitted by the sub-pixels is deflected from the one ends to the other ends of the columns of the sub-pixel array along the first direction.

4. The display panel of claim 2, wherein the first direction is a direction from middle of rows of the sub-pixel array to either ends of the rows of the sub-pixel array, and light emitted by the sub-pixels is deflected from the middle of the rows of the sub-pixel array to either ends of the rows of the sub-pixel array along the first direction; or
    wherein the first direction is a direction from middle of columns of the sub-pixel array to either ends of the columns of the sub-pixel array, and light emitted by the sub-pixels is deflected from the middle of the columns of the sub-pixel array to either ends of the columns of the sub-pixel array along the first direction.

5. The display panel of claim 2, wherein a deflection angle of light emitted from a first one of the sub-pixels along the first direction is 0°.

6. The display panel of claim 1, wherein an overall offset amount of the microlens array with respect to the sub-pixel array along the first direction is calculated by following equations:

$$l = h\,\tan\theta_1, \text{ and}$$

$$\theta_1 = \arcsin(n2/n1)*\sin\theta_2,$$

where l is the overall offset amount, h is a distance between a light-exiting surface of the microlens array and a light-exiting surface of the sub-pixel array, $\theta_2$ is a maximum deflection angle of light emitted by the sub-pixels and exiting the microlenses, $\theta_1$ is an incident angle of light emitted by the sub-pixels and incident to the microlenses, n1 is a refractive index of a filling layer in the microlenses, and n2 is a refractive index of air.

7. The display panel of claim 6, wherein apertures of the microlenses along the first direction are the same, and an offset amount of each microlens with respect to a corresponding one of the sub-pixels is calculated by following equation:

$$ln = (n\,h\,\tan\theta_1)/N,$$

where ln is offset amount of a n-th microlens with respect to its corresponding sub-pixel along the first direction, and N is a total number of the sub-pixels.

8. The display panel of claim 7, wherein an incident angle of light incident to each microlens is calculated by following equation:

$$\theta_n = \arctan\,ln/h = \arctan(n\,\tan\theta_1)/N,$$

where $\theta_n$ is an incident angle of light incident to the n-th microlen.

9. The display panel of claim 7, wherein each of the sub-pixels comprises an anode, a light emitting functional layer, and a cathode sequentially stacked in a direction far away from the substrate,
    the display panel further comprises a pixel defining layer in which a plurality of openings arranged in an array are disposed, and
    the anodes of the sub-pixels are respectively located in the plurality of openings of the pixel defining layer.

10. The display panel of claim 9, wherein the light emitting function layers of the sub-pixels are respectively located in the plurality of openings of the pixel defining layer.

11. The display panel of claim 9, further comprising a light-shielding layer on a side of the cathodes far away from the substrate and a side of the microlens array close to the substrate, wherein an orthogonal projection of the light-shielding layer on the substrate is in a gap area between orthogonal projections of adjacent ones of the microlenses on the substrate, and a spacing between any adjacent two of the microlenses in the microlens array in the first direction is equal, and
    a width of the light-shielding layer is equal to an offset amount of a first one of the two adjacent microlenses along the first direction with respect to a corresponding one of the sub-pixels, or
    the width of the light-shielding layer is equal to a distance between the two adjacent microlenses along the first direction.

12. A display apparatus, comprising the display panel of claim 1 and an optical device at a light-exiting side of the display panel, wherein the optical device comprises: a collimator on the light-exiting side of the display panel; a waveguide transmission device on a side of the collimator far away from the display panel; and an input grating and an output grating on a side of the waveguide transmission device far away from the display panel, the input grating and the output grating being disposed at one end and the other end of the waveguide transmission device, respectively, and light emitted from the collimator is incident to the input grating at a set incident angle, and the set incident angle is greater than 0° and less than 90°.

13. The display panel of claim 10, further comprising a light-shielding layer on a side of the cathodes far away from the substrate and a side of the microlens array close to the substrate, wherein an orthogonal projection of the light-shielding layer on the substrate is in a gap area between orthogonal projections of adjacent ones of the microlenses on the substrate, and a spacing between any adjacent two of the microlenses in the microlens array in the first direction is equal, and a width of the light-shielding layer is equal to an offset amount of a first one of the two adjacent microlenses along the first direction with respect to a corresponding one of the sub-pixels, or the width of the light-shielding layer is equal to a distance between the two adjacent microlenses along the first direction.

14. A method of manufacturing a display panel, comprising:

step S1: manufacturing a sub-pixel array on a substrate; and step S2: manufacturing a microlens array on the substrate on which the step S1 has been performed, wherein sub-pixels in the sub-pixel array are arranged in one-to-one correspondence with microlenses in the microlens array, the sub-pixels are arranged along a first direction, the microlenses are offset from corresponding sub-pixels along the first direction by n times of a set value, n is an ordinal number of the sub-pixels along the first direction, and aperture ratios of the sub-pixels gradually decrease along the first direction.

15. The method of claim 14, wherein the first direction is a row direction of the sub-pixel array or a column direction of the sub-pixel array, and the aperture ratio of each sub-pixel is calculated by the following equation:

$$\left[X - \left(n * \frac{X-Y}{N}\right)\right]\%,$$

where X is a maximum aperture ratio of the sub-pixels along the first direction, Y is a minimum aperture ratio of the sub-pixels along the first direction, and N is a total number of the sub-pixels, and the step S1 further comprises:

determining a maximum aperture ratio of the sub-pixels and a minimum aperture ratio of the sub-pixels along the first direction; and calculating aperture ratios of each sub-pixel according to the maximum aperture ratio of the sub-pixels and the minimum aperture ratio of the sub-pixels.

16. The method of claim 14, wherein an overall offset amount of the microlens array with respect to the sub-pixel array along the first direction is calculated by following equations:

$$l = h\tan\theta_1, \text{ and}$$

$$\theta_1 = \arcsin(n2/n1) * \sin\theta_2,$$

where l is the overall offset amount, h is a distance between a light-exiting surface of the microlens array and a light-exiting surface of the sub-pixel array, $\theta_2$ is a maximum deflection angle of light emitted by the sub-pixels and exiting the microlenses, $\theta_1$ is an incident angle of light emitted by the sub-pixels and incident to the microlenses, n1 is a refractive index of a filling layer in the microlenses, and n2 is a refractive index of air, wherein apertures of the microlenses along the first direction are the same, and an offset amount of each microlens with respect to a corresponding one of the sub-pixels is calculated by following equation:

$$ln = (n\,h\,\tan\theta_1)/N,$$

where ln is offset amount of a n-th microlens with respect to its corresponding sub-pixel along the first direction, and N is a total number of the sub-pixels, wherein an incident angle of light incident to each microlens is calculated by following equation:

$$\theta_n = \arctan ln/h = \arctan(n\tan\theta_1)/N,$$

where $\theta_n$ is an incident angle of light incident to the n-th microlen, and the step S2 further comprises:

calculating, according to a given maximum deflection angle by which light emitted by the sub-pixels and exiting the microlenses is deflected, an overall offset amount of the micro-lens array with respect to the sub-pixel array along the first direction;

calculating an offset amount of each microlens with respect to a corresponding one of the sub-pixels along the first direction according to the overall offset amount, wherein apertures of the microlenses are the same; and calculating an incident angle of light emitted by each sub-pixel and incident to a corresponding one of the microlenses according to the offset of microlens with respect to the corresponding sub-pixel.

* * * * *